(12) United States Patent
Kadota et al.

(10) Patent No.: US 6,355,945 B1
(45) Date of Patent: Mar. 12, 2002

(54) SEMICONDUCTOR OPTICAL DEVICE AND OPTOELECTRONIC INTEGRATED CIRCUIT DEVICE INCLUDING A ZNO BUFFER LAYER

(75) Inventors: Michio Kadota, Kyoto; Seiichi Arai, Takatsuki, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/339,456

(22) Filed: Jun. 24, 1999

(30) Foreign Application Priority Data

Jul. 6, 1998 (JP) .......................... 10-190696

(51) Int. Cl.[7] .............................. H01L 33/00
(52) U.S. Cl. .................. 257/82; 257/83; 257/84; 257/190
(58) Field of Search .................. 257/22, 103, 190, 257/82, 83, 84, 81; 372/44, 45, 46

(56) References Cited

U.S. PATENT DOCUMENTS 5,889,295 A * 3/1999 Rennie et al. .............. 257/96
6,023,077 A * 2/2000 Iyechika et al. ............ 257/103

FOREIGN PATENT DOCUMENTS

| DE | 3527269 | 2/1986 |
| DE | 3527274 | 2/1987 |
| DE | 19648955 | 5/1997 |
| JP | 09-260290 | * 10/1997 |

OTHER PUBLICATIONS

English Abstract von JP 057 0173 804 A, JPO & Japio, 1982.
Patent Abstracts of Japan: JP 62–296557 A, E–617, 1988, vol. 12/No. 193; and.
Patent Abstracts of Japan: JP 07254694 A, JPO, 1995.

* cited by examiner

Primary Examiner—Minh Loan Tran
(74) Attorney, Agent, or Firm—Ostrolenk, Faber, Gerb & Soffen, LLP

(57) ABSTRACT

A semiconductor optical device includes a GaAs substrate, a light-emitting/light-receiving layer including a GaN-based compound semiconductor, and a ZnO film formed between the GaAs substrate and the light-emitting/light receiving layer.

2 Claims, 3 Drawing Sheets

SEMICONDUCTOR OPTICAL DEVICE AND OPTOELECTRONIC INTEGRATED CIRCUIT DEVICE INCLUDING A ZNO BUFFER LAYER

BACKGROUND OF THE INVENTION

1. Field of the Invention

The present invention relates to semiconductor optical devices using compound semiconductors, and more particularly, to an optoelectronic integrated circuit device (OEIC device) which has an electronic circuit section and an optical circuit section on a GaAs substrate and performs interconnection (mutual conversion) between electrical signals and optical signals in a light-emitting layer composed of a compound semiconductor.

2. Description of the Related Art

OEIC devices including monolithic integration of electronic circuit sections and optical circuit sections on one substrate are under consideration as key devices for broadband, massive optical communication.

In the configuration of an optoelectronic integrated circuit device which has been recently studied, a GaN light-emitting layer emitting blue short-wavelength light is formed on a GaAs substrate for performing interconnection between electrical signals and optical signals in the light-emitting layer.

When the GaN light-emitting layer is formed on the GaAs substrate, the following problems arise. When a GaN film having high crystallinity which can be used as a light-emitting device is formed, a significantly high deposition temperature is required due to physical properties thereof. When the film is formed by a MOCVD process, which is a most conventional process, deposition must be performed in a high temperature atmosphere of more than 1,000° C., although the temperature depends on the deposition process.

On the other hand, the GaAs substrate causes so-called "arsenic elimination" at approximately 300° C. or more in which the arsenic component is vaporized from the substrate. The arsenic-eliminated portions form pits and thus many dimples form on the substrate. These dimples significantly deteriorate crystallinity of the GaN film formed on the GaAs substrate. Thus, it is significantly difficult to form a GaN light-emitting layer with high crystallinity on a GaAs substrate at an inevitably high temperature.

Lattice constants of GaAs and GaN are 5.653 Å and 3.180 Å, respectively, and are quite different from each other. By such mismatch in lattice constant, the GaN film formed on the GaAs substrate has many lattice defects, as another problem.

In order to prevent these problems, that is, arsenic elimination and lattice mismatch, a proposed method is to previously form a GaN low-temperature-deposited buffer layer on a GaAs substrate at a low temperature which does not cause arsenic elimination. Since the buffer layer functions as a protective film for preventing arsenic elimination in this method, arsenic elimination does not occur when the subsequent deposition of GaN is performed in a high-temperature atmosphere and a GaN film having high crystallinity can be formed. Determination of the optimized deposition temperature for, and the thickness of, the low-temperature-deposition buffer layer, however, are not always feasible. Thus, a new problem, that is, an unstable deposition process arises.

Accordingly, no OEIC device including a semiconductor light-emitting device formed on a GaAs substrate and in which an electronic circuit section and an optical circuit section are monolithically integrated has been realized.

SUMMARY OF THE INVENTION

The present invention provides an OEIC device including a semiconductor optical device composed of a compound semiconductor formed on a GaAs substrate and monolithic integration of an electronic circuit section and an optical circuit section.

The semiconductor optical device comprises: a GaAs substrate; a light-emitting/light-receiving layer comprising a GaN-based compound semiconductor; and a ZnO film formed between the GaAs substrate and the light-emitting/light-receiving layer.

The optoelectronic integrated circuit device comprises: a GaAs substrate including an electronic circuit processing an electronic signal; a ZnO layer on at least portion of the GaAs substrate; and an optical circuit electrically connected to the electronic circuit and comprising at least one GaN-based compound semiconductor layer on the ZnO layer, wherein the GaN-based compound semiconductor layer either receives or emits an optical signal.

According to the present invention, since the difference in lattice constant between the ZnO film as a buffer layer and GaN-based layer as a light-emitting/light receiving layer is significantly small, the formed GaN based layer has high crystallinity. The ZnO film deposited by the sputtering process is spontaneously a-axis-orientated. Therefore, a ZnO film suitable for a buffer layer can be formed without particular attention in the film deposition process and a stabilized deposition process is achieved. The sputtering process can suppress the film deposition temperature to approximately 200° C. (approximately 300° C. at most). This makes it possible to form the buffer layer without arsenic elimination from the GaAs substrate. The buffer layer is formed by a low-temperature deposition process, so that adverse effects of high temperature on the metallization in the electronic circuit section of the OEIC device can be suppressed. In addition, the ZnO film covers the metallization so as not to be directly exposed to high temperature during the formation of the GaN layer. This also suppress adverse effects of high temperature. An ECR-MBE process enables the formation of the GaN layer at a relatively low temperature, and adverse effects of high temperature can be more suppressed.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
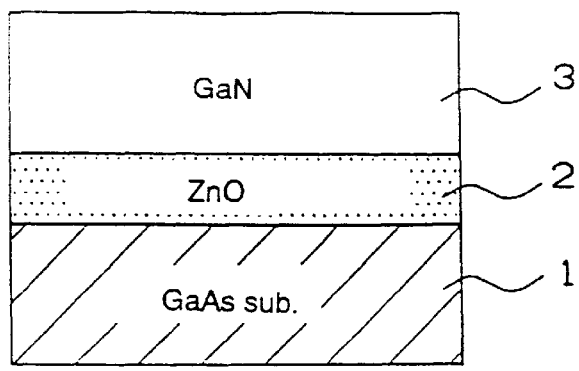
FIG. 1 is a cross-sectional view of a semiconductor light-emitting device of a first embodiment in accordance with the present invention.

In accordance with the present invention, it has been discovered that a ZnO film may be used as a buffer layer for forming a light-emitting layer composed of a compound semiconductor, and has the following remarkable advantages.

The ZnO film formed on the GaAs substrate is oriented in the c axis, and the difference in lattice constant between c-axis-oriented ZnO film and GaN is significantly small. Thus, misfit dislocation caused by lattice mismatch is suppressed, and thus the formed light-emitting layer has reduced dislocation and high crystallinity. As the compound semiconductor for the light-emitting layer in the present invention, Group III–V compound semiconductors and mixed crystals thereof are used. Examples of usable compound semiconductors include GaN, $Al_xGa_{1-x}N$, $In_xGa_{1-x}N$, and $In_xGa_yAl_{1-x-y}N$. These semiconductors may be collectively referred to as "GaN-based semiconductors". Since these compound semiconductors have a significantly small difference in lattice constant from the ZnO film, the formed light-emitting layer has significantly high crystallinity. Furthermore, light-emitting characteristics of these compound semiconductors do not deteriorate by slight dislocation; hence, the compound semiconductors are suitable for OEIC devices which require stable luminescence.

The ZnO film is generally formed by a sputtering process. The ZnO film formed by the sputtering process is spontaneously oriented in the c axis. Thus, a ZnO film suitable for a buffer layer can be formed by a film deposition process without particular attention. In the sputtering process, the film deposition temperature can be lowered to approximately 200° C. (approximately 300° C. at most). Thus, the buffer layer can be formed without arsenic elimination from the GaAs substrate.

Since the electronic circuit section and the optical circuit section are formed using different materials in the OEIC device, differences in forming conditions yield various problems. Since the formation of the compound semiconductor as the light-emitting layer requires a high-temperature process, adverse effects of the electronic circuit on metallization at high-temperature treatment are great problems in the production process of the OEIC device. When the ZnO film is used as the buffer layer, the buffer layer can be formed at a low temperature of approximately 200° C., and thus metallization is not substantially damaged. Since the metallization is covered with the ZnO film in the high-temperature process for forming the GaN layer, the metallization is not directly exposed to the high-temperature atmosphere. Accordingly, the ZnO film functions also as a protective film for preventing arsenic elimination from the GaAs substrate in the high-metallization. According to experiments by the present inventors, when the ZnO film is formed, adverse effects on the metallization can be suppressed within the allowable range by maintaining the deposition temperature of the GaN layer at 800° C. or less. A polyimide film as a protective film may be additionally provided between the Zno film and the metallization to further suppress the effects on the metallization, although the production process is complicated.

The compound semiconductor can be formed at a relatively low temperature (approximately 700° C. at most) by an ECR-MBE process. The detailed condition for forming the compound semiconductor layer is disclosed in the U.S. application Ser. No. 09/201,924, Japanese Patent Application No. 9-331884, German Patent Application No. 19855476.1 and Dutch Patent Application No. 1010698, the entire disclosures of which are hereby incorporated by reference. As described above, the adverse effects of the high-temperature process on the metallization are significant problems, but the temperature can be lowered to approximately 700° C. in the ECR-MBE process. This can significantly suppress adverse effects on the metallization, in addition to the function of the ZnO film as the protective film. Any other film deposition process, such as an RF-MBE process, may be employed instead of the ECR-MBE process, as long as the light-emitting layer can be formed at a film deposition temperature of 800° C. or less.

In the OEIC device of the present invention, a ZnO as an optical waveguide may be provided in at least one part of the optical circuit section. Since the optical waveguide and the buffer layer are formed of the same material, that is, ZnO, a series of the production processes of the OEIC device can be simplified. Since the device enables propagation of optical signals without using optical fibers, working for attachment of the optical fibers is not necessary and thus production processes can be simplified.

Hereinafter, the preferred embodiments of the present invention are explained in detail with reference to the drawings.

First Embodiment

FIG. 1 is a cross-sectional view of a semiconductor light-emitting device of a first embodiment in accordance with the present invention. In the drawing, numeral 1 represents a GaAs substrate, numeral 2 represents a ZnO film, and numeral 3 represents a GaN layer. The ZnO film 2 is a buffer layer for forming the GaN layer 3, and the GaN layer 3 functions as a light-emitting layer in the semiconductor light-emitting device.

The semiconductor light-emitting device in this embodiment is formed by the following procedure. First, a GaAs substrate 1 is prepared. Next, a ZnO film 2 with a thickness of approximately 3 μm is formed on the GaAs substrate 1 by, for example, an RF magnetron sputtering process. The ZnO film 2 is a c-axis-oriented polycrystalline film, and functions as a buffer layer for forming a GaN layer 3. In the RF magnetron sputtering process, the film is deposited while the substrate is heated, and the substrate temperature is generally set at approximately 200° C. (not higher than 300° C.).

After the ZnO film 2 is deposited, a GaN layer 3 as a light-emitting layer is formed on the ZnO film 2. The GaN layer 3 is formed by an ECR-MBE process. In detail, using an ECR-MBE system (not shown in the drawing) having a plasma generating region and a film depositing region, an electronic cyclotron resonance (ECR) phenomenon is generated in the plasma generating region to form plasma nitrogen gas. The plasma nitrogen gas is fed into the film depositing region for the reaction with metallic Ga fed from a Knudsen cell provided in the film depositing region in order to form w the GaN layer 3 on the silicon substrate provided in the film depositing region. In the ECR-MBE process, the GaN layer 3 can be satisfactorily formed without further increasing the substrate temperature, because the material gas has high energy because of the ECR plasma state. For example, the GaN layer 3 can be formed at a substrate temperature of approximately 700° C. In this embodiment, the film is deposited at a substrate temperature of 720° C.

Second Embodiment

Figure 2:
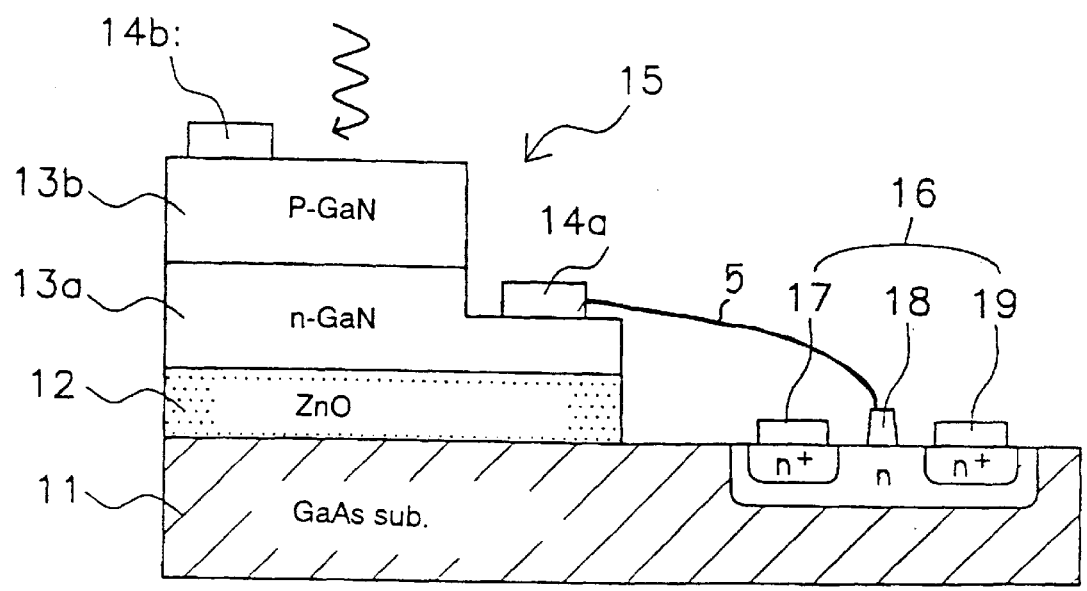
FIG. 2 is a cross-sectional view of an OEIC device of a second embodiment in accordance with the present invention.

FIG. 2 is a cross-sectional view of an OEIC device of a second embodiment in accordance with the present invention, in which a photodiode 15 as an optical circuit section and a metal-semiconductor field effect transistor (MESFET) 16 as an electronic circuit section are formed on a GaAs substrate 11. In the drawing, numeral 11 represents a GaAs substrate, numeral 12 represents a ZnO film, numerals 13a and 13b represent an n-type GaN layer and a p-type GaN layer, respectively, for receiving light, numerals 14a and 14b represent an n-electrode and a p-electrode, respectively, numerals 17 and 19 represent a source electrode and a drain electrode, respectively in the MESFET 16, and numeral 18 represents a gate electrode. The photodiode 15 is electrically connected through wiring 5.

In the production of the OEIC device in this embodiment, a FET 16 as an electronic circuit section is formed using a process generally used for forming GaAs semiconductor devices, for example, a photolithographic, ion implantation, or etching process.

Next, using the method described in the first embodiment, a ZnO film 12, an n-type GaN layer 13a, and a p-type GaN layer 13b are deposited in that order. The n-type GaN layer 13a and the p-type GaN layer 13b are formed by adding any suitable impurity, such as Si or Mg, when the GaN layer is formed. Unnecessary portions of the n-type GaN layer 13a, the p-type GaN layer 13b, and the ZnO film 12 are removed by an RIE process or the like to form the n-electrode 14a on the n-type GaN layer 13a and the p-electrode 14b on the p-type GaN layer 13b. The photodiode 15 as an optical circuit section is thereby formed. The resulting OEIC device converts external optical signals to electrical signals, which control the operation of the FET 16, in the photodiode 15.

When the GaN layers 13a and 13b are formed at the high temperature in the production of the OEIC device by the above-mentioned process, metallization in the FET 16 as the electronic circuit section are protected by the ZnO film 12 and are not directly exposed to a high temperature. Since the deterioration of characteristics of the FET 16 is suppressed, the OEIC device maintains superior characteristics.

Although the light-receiving layer is composed of the GaN layer in this embodiment, a light-receiving layer composed of AlGaN, InGaN, or the like also has similar advantages. Although the FET is formed as the electronic circuit section, any other electrical circuit, such as HEMT, may be formed. Although the photodiode 15 is formed after the electronic circuit section 16 is formed in this embodiment, the electronic circuit section 16 may be formed after the formation of the photodiode 15.

Third Embodiment

Figure 3:
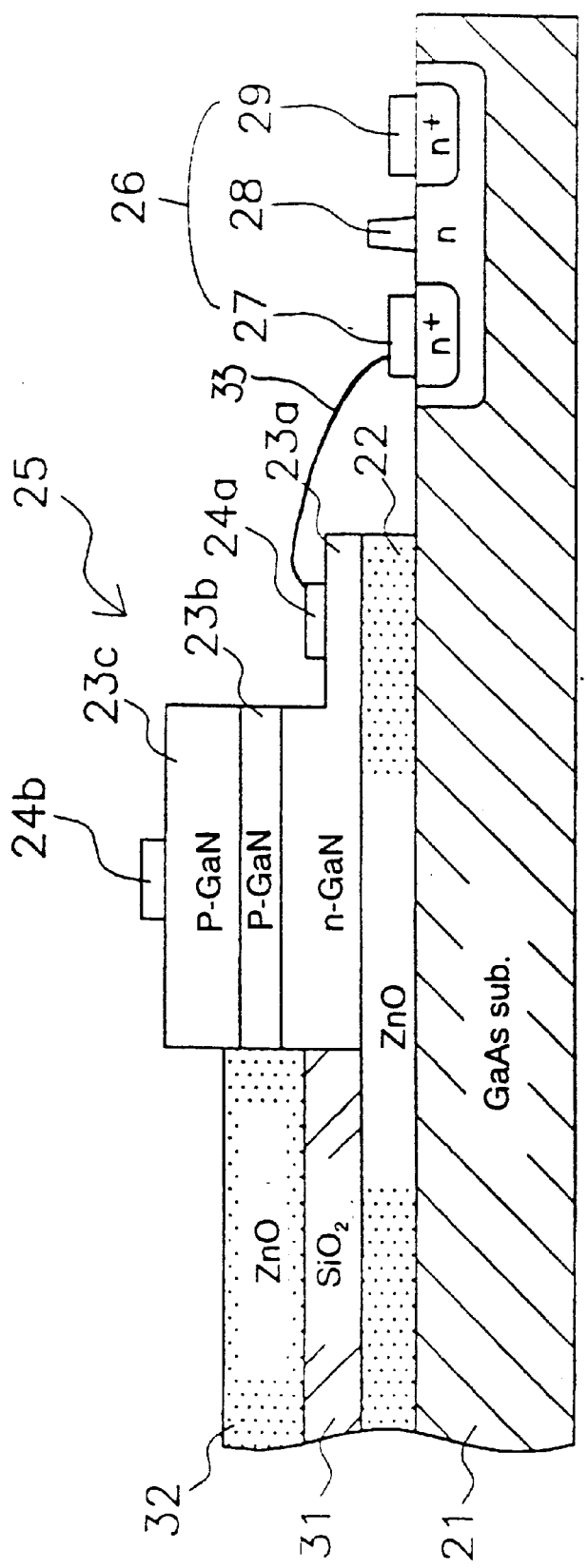
FIG. 3 is a cross-sectional view of an OEIC device of a third embodiment in accordance with the present invention.

FIG. 3 is a cross-sectional view of an OEIC device of a third embodiment in accordance with the present invention, in which a laser 25 as an optical circuit section, an optical waveguide 32 composed of ZnO film as an optical circuit section, and a FET 26 as an electronic circuit section are formed on a GaAs substrate 21. In the OEIC device, the FET 26 and the laser 25 are electrically connected through wiring 33, and a laser beam from the laser 25 as the optical circuit section is controlled by adjusting the voltage applied to a gate electrode 28 in the FET 26 as the electronic circuit section. Since the configuration of the FET 26 is not different from that in the second embodiment, the description thereof is omitted.

In the drawing, numeral 21 represents a GaAs substrate, numeral 22 represents a ZnO film as a buffer layer, numeral 23a represents an n-type GaN clad layer, numeral 23b represents a p-type GaN active layer, numeral 23c represents an n-type GaN clad layer, and numerals 24a and 24b represent an n-electrode and a p-electrode, respectively. The layers 23a to 23c constitute a resonator of the laser 25. An optical waveguide 32 for propagating laser light oscillated at the interface between the n-type GaN clad layer 23a and the p-type GaN active layer 23b is formed on one side of the resonator A $SiO_2$ film 31 is formed between the optical waveguide 32 and the ZnO film 22 as the buffer layer. Since the optical waveguide 32 is composed of ZnO, such an arrangement of ZnO having a high refractive index on $SiO_2$ having a low refractive index causes convergence of laser light in the ZnO. Thus, the ZnO functions as the optical waveguide.

Since the buffer layer and the optical waveguide are formed of the same material, the film deposition process can be simplified. Since the device propagates optical signals without using optical fibers, time-consuming work required in attachment of optical fibers is not necessary and the production process of the OEIC device is simpler.

Although the $SiO_2$ film is formed under the ZnO film 32 in this embodiment, a film composed of any other material having a refractive index which is lower than that of ZnO may be formed. The entire optical waveguide 32 may be covered with a $SiO_2$ film or the like in order to improve propagation efficiency in the optical waveguide 32. Although the clad layers are the n-type GaN layer 23a and the p-type GaN layer 23c, and the active layer is the p-type GaN layer 23b in this embodiment, these layers may be an n-type AlGaN clad layer, a p-type AlGaN clad layer, and a p-type InGaN active layer. Furthermore, the active layer has a single quantum well structure or a multiquantum well structure composed of InGaN and GaN.

Fourth Embodiment

Figure 4:
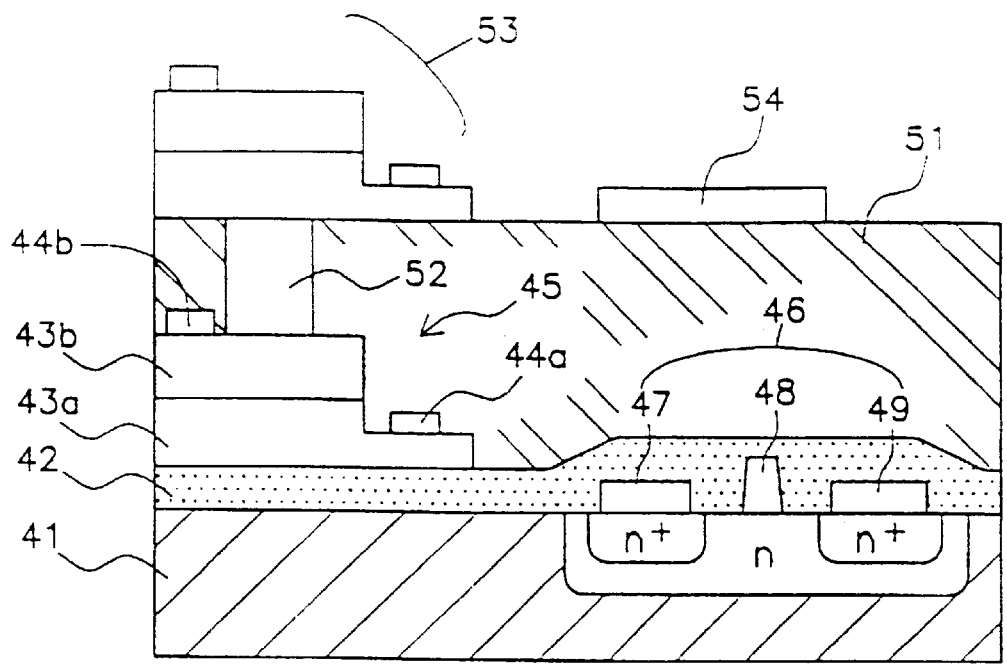
FIG. 4 is a cross-sectional view of an OEIC device of a fourth embodiment in accordance with the present invention.

FIG. 4 is a cross-sectional view of an OEIC device of a fourth embodiment in accordance with the present invention, in which a light-emitting diode 45 and a photodiode 53 as an optical circuit section, respectively, an optical waveguide 52 composed of ZnO as an optical circuit section, and a FET 46 as an electronic circuit section are formed on a GaAs substrate 41. In the OEIC device, luminescence from the light-emitting diode 45 as the optical circuit section is controlled by adjusting the voltage applied to a gate electrode 48 in the FET 46 as the electronic circuit w section. Since the configuration of the electronic circuit section is not different from that in the second embodiment, the description thereof is omitted.

In the drawing, numeral 41 represents a GaAs substrate, numeral 42 represents a ZnO film as a buffer layer, numerals 43a and 43b represent an n-type GaN layer, a p-type GaN layer, respectively, constituting the light-emitting diode 45, and numerals 44a and 44b represent an n-electrode and a p-electrode, respectively. A thick $SiO_2$ film 51 is deposited on the light-emitting diode 45 and the FET 46. In the $SiO_2$ film 51, the SiO2 is removed only at the position corresponding to the upper section of the p-type GaN layer, and the ZnO film (optical waveguide) 52 is provided. The photodiode 53 for receiving optical signals emerging from the light-emitting diode 45 is formed on the optical waveguide 52. An electronic circuit device 54 such as an inductor is formed on the $SiO_2$ film 51.

Since ZnO film having a high refractive index is disposed in the $SiO_2$ film 51 having a low refractive index, optical signals converges in the ZnO film so that the ZnO film functions as the optical waveguide. Since the buffer layer and the optical waveguide are formed of the same material, the film deposition process can be simplified. Since the device propagates optical signals without using optical fibers, time-consuming working for attachment of optical fibers is not necessary and the production process of the OEIC device is more simplified.

Although the $SiO_2$ film 51 is provided around the ZnO film 52 in this embodiment, a film composed of any other material having a refractive index which is lower than that of ZnO may be provided.

Fifth Embodiment

The OEIC device of the present invention is not limited to the above-mentioned embodiments.

Figure 5:
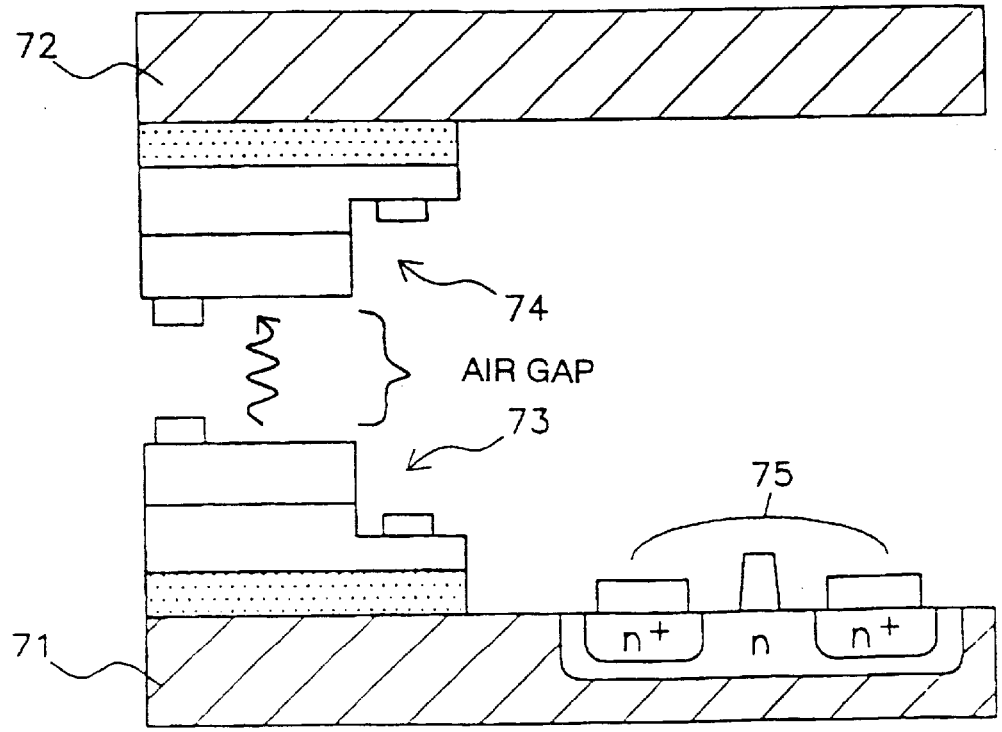
FIG. 5 is a cross-sectional view of an OEIC device of a fifth embodiment in accordance with the present invention.

For example, as shown in FIG. 5, in a fifth embodiment in accordance with the present invention, two GaAs substrates 71 and 72, each constituting an OEIC device, may be opposingly disposed so that a light-emitting diode 73 and a photodiode 74 overlap to form a complex OEIC device. In such a configuration of the OEIC device, the photodiode 74 formed on the GaAs substrate 72 can convert optical signals from the light-emitting diode 73, which is controlled by a FET 75 on the GaAs substrate 71, to electrical signals. In this case, the light-emitting diode 73 and the photodiode 74 may be spaced with an air gap, and thus an additional $SiO_2$ film or the like is not necessary.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An optoelectronic integrated circuit device comprising:

a GaAs substrate including an electronic circuit for processing an electronic signal;

a ZnO layer on at least a portion of the GaAs substrate;

an optical circuit electrically connected to the electronic circuit and comprising at least one GaN-based compound semiconductor layer on the ZnO layer, wherein the GaN-based compound semiconductor layer either receives or emits an optical signal;

an additional layer of ZnO which is optically connected to the optical circuit and dimensioned so as to function as an optical waveguide; and an $SiO_2$ layer in contact with the additional layer of ZnO.

2. An optoelectronic integrated circuit apparatus comprising a pair of optoelectronic integrated circuit devices each of which comprises a GaAs substrate including an electronic circuit for processing an electronic signal; a ZnO layer on at least a portion of the GaAs substrate; and an optical circuit electrically connected to the electronic circuit and comprising at least one GaN-based compound semiconductor layer on the ZnO layer, wherein the GaN-based compound semiconductor layer either receives or emits an optical signal, one of said pair further comprising a MESFET, wherein each of said devices of said pair is disposed in optical communication with the other such that the respective GaN-based semiconductor layers thereof face one another and are separated by a gap.

* * * * *